United States Patent
Takayama

(10) Patent No.: US 6,571,379 B2
(45) Date of Patent: May 27, 2003

(54) SEMICONDUCTOR INTEGRATED CIRCUIT AND SEMICONDUCTOR INTEGRATED CIRCUIT WIRING LAYOUT METHOD

(75) Inventor: Kazuhisa Takayama, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/888,992

(22) Filed: Jun. 25, 2001

(65) Prior Publication Data

US 2001/0054721 A1 Dec. 27, 2001

(30) Foreign Application Priority Data

Jun. 26, 2000 (JP) ..................... 2000-191750

(51) Int. Cl.[7] .............................. G06F 17/50
(52) U.S. Cl. .............................. 716/10; 716/8
(58) Field of Search ................. 716/10, 1–14

(56) References Cited

U.S. PATENT DOCUMENTS 4,777,606 A * 10/1988 Fournier ............... 716/12
4,893,170 A * 1/1990 Tokuda et al. ......... 257/207
5,483,461 A * 1/1996 Lee et al. .............. 716/14

FOREIGN PATENT DOCUMENTS

JP          1-283847          11/1989

* cited by examiner

Primary Examiner—Vuthe Siek
Assistant Examiner—Sun James Lin
(74) Attorney, Agent, or Firm—Choate, Hall & Stewart

(57) ABSTRACT

A semiconductor integrated circuit includes a first wiring layer formed in a first direction, a second wiring layer formed in a second direction perpendicular to the first direction, and a third wiring layer formed in the second direction to sandwich the first wiring layer between the third wiring layer and the second wiring layer. The second and third wiring layers are shifted from each other by a predetermined distance in the first direction. An automatic layout method for a semiconductor integrated circuit, and a recording medium are also disclosed.

5 Claims, 3 Drawing Sheets

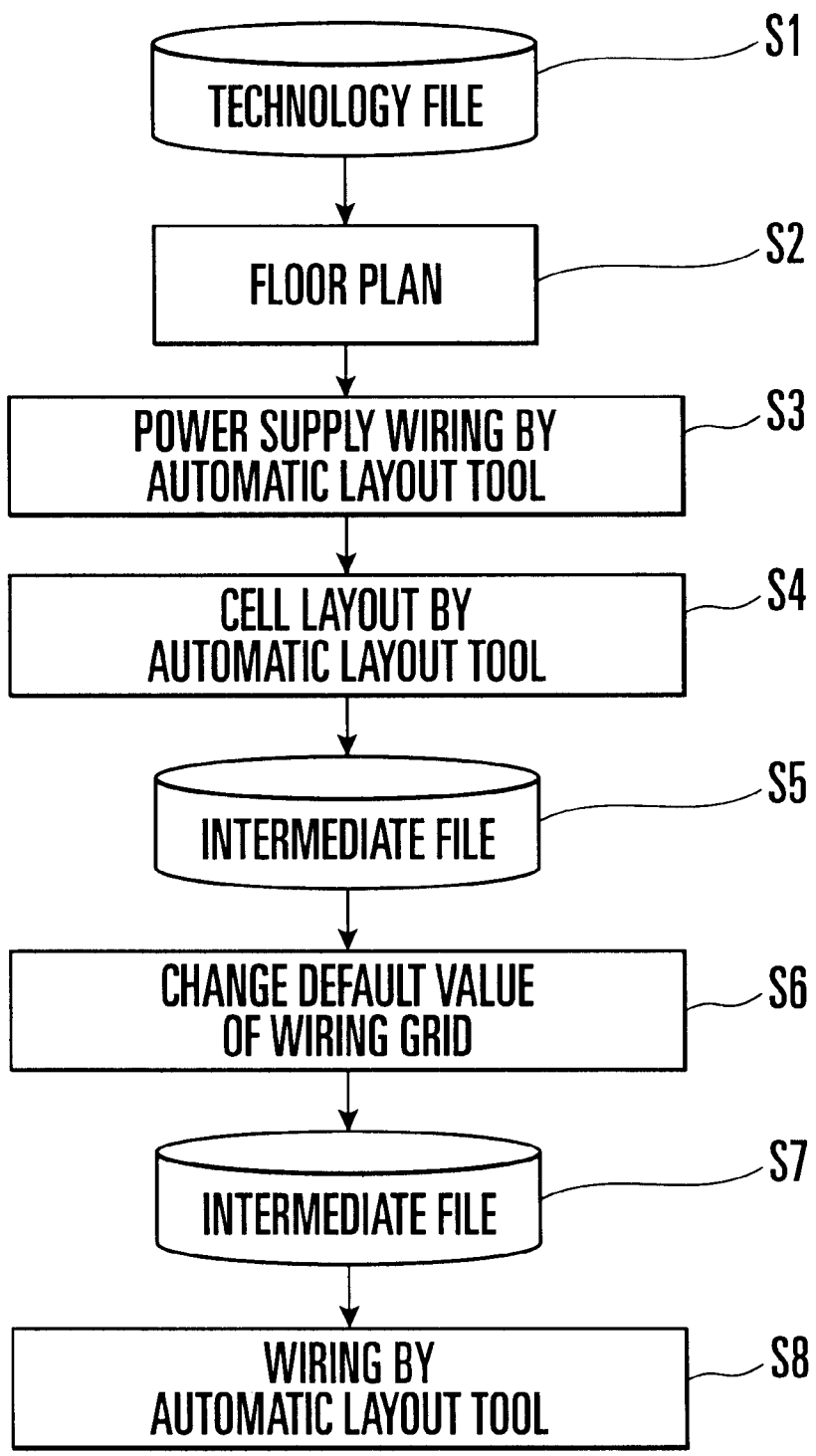
F I G. 2

US 6,571,379 B2

SEMICONDUCTOR INTEGRATED CIRCUIT AND SEMICONDUCTOR INTEGRATED CIRCUIT WIRING LAYOUT METHOD

BACKGROUND OF THE INVENTION

The present invention relates to a semiconductor integrated circuit and semiconductor integrated circuit wiring layout method capable of reducing the parasitic capacitance between different wiring layers.

FIG. 4 shows a layout having undergone automatic wiring processing by a conventional method. In FIG. 4, lower grid lines 10 are center lines for first aluminum wiring lines laid out in the X direction at the same pitch in the Y direction. Grid lines 20 above the grid lines 10 are center lines for second aluminum wiring lines laid out in the X direction at the same pitch in the Y direction. Grid lines 30 above the grid lines 20 are center lines for third aluminum wiring lines laid out in the X direction at the same pitch in the Y direction.

Similarly, lower grid lines 11 are center lines for first aluminum wiring lines laid out in the Y direction at the same pitch in the X direction. Grid lines 21 above the grid lines 11 are center lines for second aluminum wiring lines laid out in the Y direction at the same pitch in the X direction. Grid lines 31 above the grid lines 21 are center lines for third aluminum wiring lines laid out in the Y direction at the same pitch in the X direction.

First aluminum power supply wiring lines 110 and 111, and first aluminum signal wiring lines 120, 121, 122, and 123 are laid out in the X direction by using the grid lines 10 as center lines. Upper second aluminum signal wiring lines 210, 211, 212, 213, 214, and 215 are laid out in the Y direction by using the grid lines 21 as center lines. Similar to the first aluminum signal wiring lines, upper third aluminum signal wiring lines 310, 311, 312, and 313 are laid out in the X direction by using the grid lines 30 as center lines.

In FIG. 4, the start point coordinates of grid lines are set to the same in all the layers, and the wiring pitch is also the same. Thus, the first aluminum signal wiring line 120 and third aluminum signal wiring line 310, the first aluminum signal wiring line 121 and third aluminum signal wiring line 312, and the first aluminum signal wiring lines 122 and 123 and third aluminum signal wiring line 313 completely overlap each other.

As described above, the automatic layout technique of a semiconductor integrated circuit inevitably suffers a decrease in distance between adjacent wiring lines and overlap on an upper wiring line. A parasitic capacitance generated between wiring lines causes crosstalk.

SUMMARY OF THE INVENTION

It is an object of the present invention to provide a semiconductor integrated circuit and semiconductor integrated circuit wiring layout method capable of reducing the parasitic capacitance between different wiring layers.

To achieve the above objects, according to the present invention, there is provided a semiconductor integrated circuit comprising a first wiring layer formed in a first direction, a second wiring layer formed in a second direction perpendicular to the first direction, and a third wiring layer formed in the second direction to sandwich the first wiring layer between the third wiring layer and the second wiring layer, wherein the second and third wiring layers are shifted from each other by a predetermined distance in the first direction.

BRIEF DESCRIPTION OF THE DRAWINGS

FIG. 2 is a flow chart showing wiring layout procedures according to the present invention;

DESCRIPTION OF THE PREFERRED EMBODIMENT

The present invention will be described in detail below with reference to the accompanying drawings.

Figure 1A:
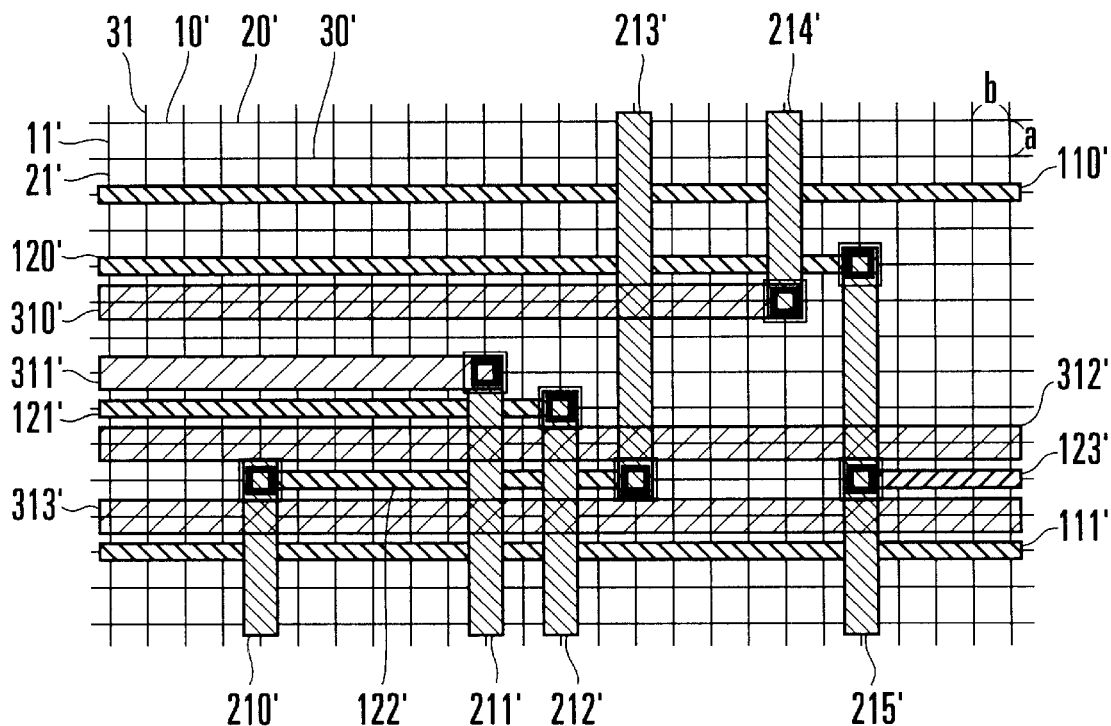
FIGS. 1A and 1B are a view showing the wiring layout of a semiconductor integrated circuit according to an embodiment of the present invention, and a view for explaining a wiring layer.
Figure 1B:
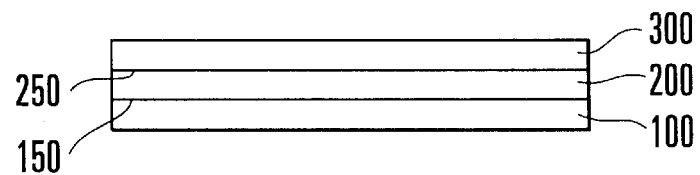

FIGS. 1A and 1B show a semiconductor integrated circuit according to an embodiment of the present invention. As shown in FIG. 1B, the semiconductor integrated circuit of this embodiment has a multilayered structure made up of a first wiring layer 200 formed on a substrate (not shown) in the first direction, and second and third wiring layers 100 and 300 formed in the second direction perpendicular to the first direction. An insulating layer 150 is formed between the first and second wiring layers 200 and 100, and an insulating layer 250 is formed between the first and third wiring layers 200 and 300.

The second and third wiring layers 100 and 300 which are formed in the second direction and sandwich the first wiring layer 200 formed in the first direction are shifted from each other in the first direction by a predetermined distance, as will be described below. The shift distance is set to almost ½ the wiring pitch of the semiconductor integrated circuit.

Details of the wiring layout of the semiconductor integrated circuit having this structure will be described with reference to FIG. 1A.

In the wiring layout shown in FIG. 1A, lower grid lines 10' are center lines for first aluminum wiring lines (second wiring layer 100) laid out in the X direction at a pitch a in the Y direction. Grid lines 20' above the grid lines 10' are center lines for second aluminum wiring lines (first wiring layer 200) laid out in the X direction at the pitch a in the Y direction. Grid lines 30' above the grid lines 20' are center lines for third aluminum wiring lines (third wiring layer 300) laid out in the X direction at the pitch a in the Y direction by using, as a reference, start point coordinates shifted from those of the grid line 10' by half the grid in the Y direction.

Similarly, lower grid lines 11' are center lines for first aluminum wiring lines (second wiring layer 100) laid out in the Y direction at a pitch b in the X direction. Grid lines 21' above the grid lines 11' are center lines for second aluminum wiring lines (first wiring layer 200) laid out in the Y direction at the pitch b in the X direction. Grid lines 31' above the grid lines 21' are center lines for third aluminum wiring lines (third wiring layer 300) laid out in the Y direction at the pitch b in the X direction by using, as a reference, start point coordinates shifted from that of the grid line 11' by half the grid in the X direction.

As described above, the interval between wiring grids is the same pitch a or b in a given direction on any wiring layer. The pitches a and b may be the same.

Figure 4:
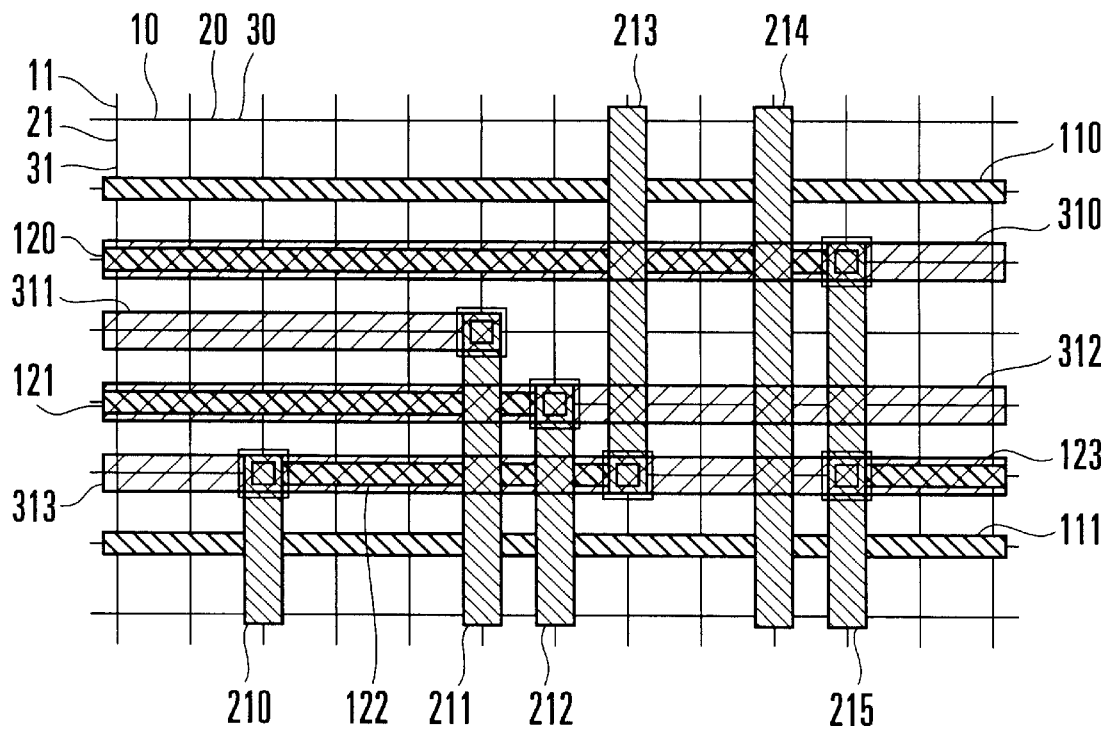
FIG. 4 is a view showing a conventional wiring layout.

In automatic wiring processing after start point coordinates are changed, wiring lines are connected almost similarly to the layout in FIG. 4. After wiring processing, as shown in FIG. 1A, the grid lines 30' serving as center lines are shifted by half the grid in the Y direction, which prevents third aluminum signal wiring lines 310' to 313' (third wiring layer 300) from overlapping first aluminum signal wiring lines 120' to 123' laid out in the X direction.

Figure 3:
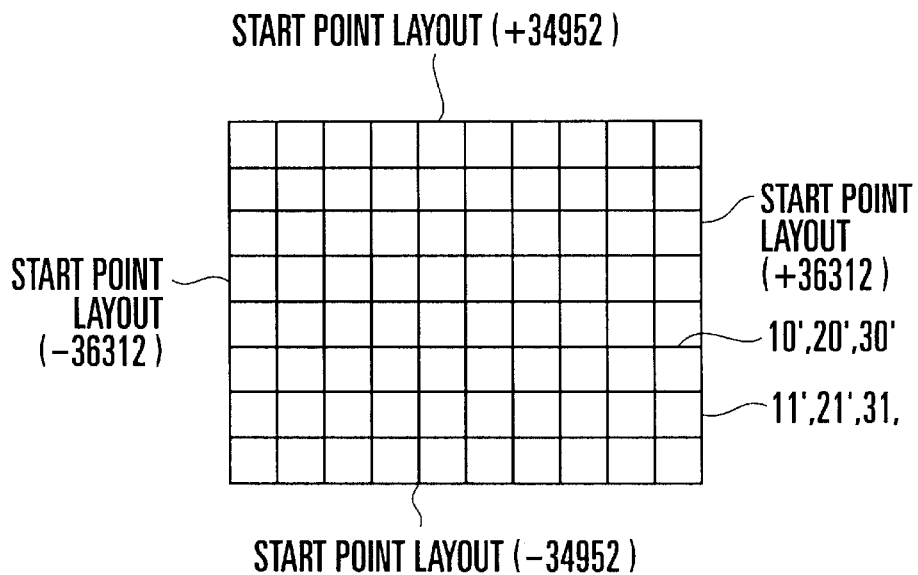
FIG. 3 is a view for explaining the start point coordinates of a grid line.

Note that the start point coordinates are the positions of the two ends (right-to-left direction in FIG. 3) of each of the grid lines 10' and 20' in the X direction, and the positions of the two ends (top-to-bottom direction in FIG. 3) of each of the grid lines 11', 21', and 31' in the Y direction.

Procedures for obtaining the above-described wiring layout will be described with reference to the flow chart of FIG. 2.

After a technology file based on a design rule is read (step S1), the floor plan of a chip is created (step S2). The pitches and start point coordinates of grid lines are determined at this stage (initial setting). The initially set pitch and start point coordinates are the same for the grid lines of the respective wiring layers. Power supply wiring is done by using an automatic layout tool (step S3), and then cells are laid out (step S4). In the conventional method, wiring processing is subsequently performed.

In the method of the present invention, an intermediate file is output before wiring processing (step S5), and the start point coordinates of the grid lines of a predetermined wiring layer included in the intermediate file are changed (step S6). Then, an intermediate file including the changed start point coordinates of the grid lines is generated (step S7). The generated intermediate file is read, and wiring processing is done by using the automatic layout tool (step S8). Processing from steps S5 to S7 is automatically performed without any manual operation.

Processing of changing the start point coordinates of grid lines will be explained.

According to the first method, a shift value, i.e., default value n by which the start point coordinates of grid lines are shifted is set in advance, and the default value n is added/subtracted to/from the start point coordinates of the grid line of a predetermined wiring layer included in the intermediate file output in step S5. A wiring pitch (e.g., "136" for a pitch of 1.36 μm) and start point coordinates in the X and Y directions (position coordinates of chip side portions with respect to the origin coordinate "0" of the chip center) are described in the intermediate file output in step S5 in order to lay out the grid lines of respective aluminum wiring layers in a matrix. For a pitch of "136", the default value n must be set to 0<n<136 so as to prevent wiring lines from overlapping each other at the same pitch. In this manner, the default value n can be added/subtracted to/from the start point coordinates of a target aluminum wiring layer, thereby shifting grid lines in the same direction without overlapping each other.

The second method of changing the start point coordinates of grid lines will be described.

According to the second method, the wiring pitch of the intermediate file output in step S5 is read, and the integrated result is set as an arbitrary moving distance and added/subtracted to/from start point coordinates.

The wiring pitch item of a target aluminum wiring layer is read, and if the wiring pitch is "136", "68" which is ½ the wiring pitch is set as a moving distance in order to set half the pitch as the moving distance from, e.g., start point coordinates. The value "68" is added/subtracted to/from the start point coordinates of the target aluminum wiring layer to move grid lines in the same direction without causing the grid lines to overlap each other.

The third method of changing the start point coordinates of grid lines will be described.

A table prepared in advance has the pitch of a grid line, and start point coordinate data described for each wiring pitch uniform in the X and Y directions. Slightly large maximum values of start point coordinates are designated in accordance with a target chip size. In this case, start point coordinates are set to the same for respective aluminum wiring layers, but only the start point coordinates of an aluminum wiring layer to be moved are set to ones obtained by calculating an arbitrary moving distance.

In set value change processing in step S6, a chip size is read from the intermediate file output in step S5. Start point coordinate values equal to or smaller than the wiring pitch are read from a table looked up for each aluminum wiring layer in accordance with the obtained chip size. The intermediate file is corrected based on the obtained start point coordinates, and output as a corrected intermediate file in step S7.

The above-mentioned table contains a grid line format created in advance as a file format.

More specifically, start point coordinates are described by a multiple of the pitch for each wiring layer so as to freely select the start point coordinates in accordance with the chip size. In the following example, a designed chip size is assumed to range from 20,000 to 40,000.

A value equal to or smaller than the wiring pitch (e.g., "136") is extracted from chip size information obtained from an automatic layout. For the third wiring layer 300, an arbitrary distance by which the third wiring layer 300 is moved from the first and second wiring layers 200 and 100 is set. For the third wiring layer 300, a shift value of ½ the grid from the first and second wiring layers 200 and 100 is set.

An example of format tables for a wiring pitch of 1.36 μm will be described.

(1) Format Table of First Wiring Layer 200

TRACKS X 20128 STEP 136 LAYER METAL1;
    TRACKS X −20128 STEP 136 LAYER METAL1;
    TRACKS Y 20128 STEP 136 LAYER METAL1;
    TRACKS Y −20128 STEP 136 LAYER METAL1;
    TRACKS X 20264 STEP 136 LAYER METAL1;
    TRACKS X −20264 STEP 136 LAYER METAL1;
    TRACKS Y 20264 STEP 136 LAYER METAL1;
    TRACKS Y −20264 STEP 136 LAYER METAL1;
    TRACKS X 20400 STEP 136 LAYER METAL1;
    TRACKS X −20400 STEP 136 LAYER METAL1;
    TRACKS Y 20400 STEP 136 LAYER METAL1;
    TRACKS Y −20400 STEP 136 LAYER METAL1;
    ⋮

TRACKS X 40120 STEP 136 LAYER METAL1;
    TRACKS X −40120 STEP 136 LAYER METAL1;
    TRACKS Y 40120 STEP 136 LAYER METAL1;
    TRACKS Y −40120 STEP 136 LAYER METAL1;

(2) Format Table of Second Wiring Layer 100

TRACKS X 20128 STEP 136 LAYER METAL2;
    TRACKS X −20128 STEP 136 LAYER METAL2;
    TRACKS Y 20128 STEP 136 LAYER METAL2;
    TRACKS Y −20128 STEP 136 LAYER METAL2;
    ⋮

(same as the first wiring layer)

(3) Format Table of Third Wiring Layer 300

TRACKS X 20196 STEP 136 LAYER METAL3;

TRACKS X −20060 STEP 136 LAYER METAL3;
TRACKS Y 20196 STEP 136 LAYER METAL3;
TRACKS Y −20060 STEP 136 LAYER METAL3;
TRACKS X 20332 STEP 136 LAYER METAL3;
TRACKS X −20196 STEP 136 LAYER METAL3;
TRACKS Y 20332 STEP 136 LAYER METAL3;
TRACKS Y −20196 STEP 136 LAYER METAL3;
TRACKS X 20468 STEP 136 LAYER METAL3;
TRACKS X −20332 STEP 136 LAYER METAL3;
TRACKS Y 20460 STEP 136 LAYER METAL3;
TRACKS Y −20332 STEP 136 LAYER METAL3;

⋮
⋮

TRACKS X 40188 STEP 136 LAYER METAL3;
TRACKS X −40052 STEP 136 LAYER METAL3;
TRACKS Y 40188 STEP 136 LAYER METAL3;
TRACKS Y −40052 STEP 136 LAYER METAL3;

A description when only the third wiring layer 300 is shifted by ½ the grid on this table is as follows. The X-coordinate of the start point is "±36312", its Y-coordinate is "±34952", and the wiring pitch is 1.36 μm.

(1) First and Second Wiring Layers 200 and 100

TRACKS X 36312 STEP 136 LAYER METAL1 METAL2;
TRACKS X −36312 STEP 136 LAYER METAL1 METAL2;
TRACKS Y 34952 STEP 136 LAYER METAL1 METAL2;
TRACKS Y −34952 STEP 136 LAYER METAL1 METAL2;

(2) Third Wiring Layer 300

TRACKS X 36380 STEP 136 LAYER METAL3;
TRACKS X −36244 STEP 136 LAYER METAL3;
TRACKS Y 35020 STEP 136 LAYER METAL3;
TRACKS Y −34884 STEP 136 LAYER METAL3;

In the above embodiment, the start point coordinates of grid lines having the same pitch are set to different values depending on the wiring layer in wiring processing. The grid lines are laid out in a matrix at the same pitch in the X and Y directions. In wiring processing using an automatic layout, wiring paths are laid out by using these grid lines as centers. Shifting the start point coordinates of grid lines can eliminate any overlap.

As has been described above, according to the present invention, wiring lines are laid out while completely overlapping wiring lines between different aluminum wiring layers formed in the same direction are greatly decreased. This can considerably reduce the parasitic capacitance and prevent crosstalk. The arrangement is simple and can be easily realized.

What is claimed is:

1. An automatic layout method for a semiconductor integrated circuit having a first metal wiring layer formed along grid lines in a vertical direction, and a second metal wiring layer and a third metal wiring layer formed respectively below and above to sandwich the first layer along grid lines in a horizontal direction perpendicular to the vertical direction, comprising the steps of:

setting the grid lines of one of the second and third wiring layers laid out in the horizontal direction with a shift in start point coordinates in the vertical direction from the grid lines of the other one of the second and third wiring layers so as to prevent the grid lines of the second and third wiring layers from overlapping each other; and laying out the first, second, and third wiring layers along the set grid lines.

2. A method according to claim 1, wherein the setting step comprises the step of aligning the grid lines of the third wiring layer between the grid lines of the second wiring layer.

3. A method according to claim 2, wherein the aligning step comprises the step of aligning the grid lines of the third wiring layer at substantially a center point between the grid lines of the second wiring layer.

4. A method according to claim 1, wherein the setting step comprises the steps of creating a floor plan of a chip including pitches and start point coordinates of grid lines forming matrixed wiring grids of the first, second, and third wiring layers in accordance with a technology file, outputting an intermediate file including the pitches and start point coordinates of the grid lines before wiring processing, thereby changing Y-coordinates of start points of the grid lines of one of the second and third wiring layers, and creating an intermediate file including the changed start point coordinates, and the layout step comprises the step of performing wiring processing on the grid lines of the first, second, and third wiring layers by using an automatic layout tool in accordance with the created intermediate file.

5. A method according to claim 4, wherein the step of creating the floor plan of the chip comprises the step of initially setting the grid lines of the first, second, and third wiring layers to the same pitch and same start point coordinates.

* * * * *